(12) United States Patent
Yamamoto et al.

(10) Patent No.: US 11,222,807 B2
(45) Date of Patent: Jan. 11, 2022

(54) PROCESSING METHOD AND THERMOCOMPRESSION BONDING METHOD FOR WORKPIECE

(71) Applicant: DISCO CORPORATION, Tokyo (JP)

(72) Inventors: Naoko Yamamoto, Tokyo (JP); Yoshiaki Yodo, Tokyo (JP); Atsushi Kubo, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/839,388

(22) Filed: Apr. 3, 2020

(65) Prior Publication Data
US 2020/0335382 A1 Oct. 22, 2020

(30) Foreign Application Priority Data
Apr. 17, 2019 (JP) .............................. JP2019-078622

(51) Int. Cl.
*H01L 21/683* (2006.01)
*H01L 21/268* (2006.01)
(Continued)

(52) U.S. Cl.
CPC ........ *H01L 21/6836* (2013.01); *H01L 21/268* (2013.01); *H01L 21/78* (2013.01);
(Continued)

(58) Field of Classification Search
CPC ... H01L 21/6836; H01L 21/268; H01L 21/78; H01L 23/544; H01L 22/20;
(Continued)

(56) References Cited

U.S. PATENT DOCUMENTS 6,581,747 B1 * 6/2003 Charlier ........... G06K 19/07745
186/37
8,034,659 B2 * 10/2011 Nagai ..................... H01L 24/27
438/108
(Continued)

FOREIGN PATENT DOCUMENTS

CN    101714498 A    5/2010
JP    2010082644 A    4/2010
(Continued)

OTHER PUBLICATIONS

Search report issued in Singapore patent application No. 10202002980W, dated Jan. 19, 2021.

*Primary Examiner* — Vu A Vu
(74) *Attorney, Agent, or Firm* — Greer, Burns & Crain, Ltd.

(57) ABSTRACT

A processing method for a workpiece, which includes a stacking step of stacking a sheet and a flat plate on a front side of the workpiece to form a stack, a thermocompression bonding step of thermocompression bonding the sheet to the workpiece while planarizing the sheet with the flat plate by heating the sheet and applying an external force to the stack, a holding step of holding the workpiece via the sheet by a holding table having a transparent portion, an alignment step of performing an alignment by imaging the workpiece through the transparent portion and the sheet, and a processing step of processing the workpiece by a processing unit.

5 Claims, 12 Drawing Sheets

(51) Int. Cl.
*H01L 21/78* (2006.01)
*H01L 23/544* (2006.01)
*H01L 21/66* (2006.01)

(52) U.S. Cl.
CPC ............ *H01L 22/20* (2013.01); *H01L 23/544* (2013.01); *H01L 2221/68327* (2013.01); *H01L 2223/5446* (2013.01)

(58) Field of Classification Search
CPC ... H01L 2223/5446; H01L 2221/68327; H01L 21/67103; H01L 21/6838; H01L 21/681; H01L 21/6835; H01L 21/67092
USPC .......................................................... 438/5
See application file for complete search history.

(56) References Cited

U.S. PATENT DOCUMENTS

| | | | |
|---|---|---|---|
| 8,419,888 B2* | 4/2013 | Hamazaki | H01L 24/95 156/306.6 |
| 11,043,685 B2* | 6/2021 | Yoshida | H01M 8/1004 |
| 2013/0157415 A1 | 6/2013 | Morita et al. | |
| 2016/0381801 A1* | 12/2016 | Saruyama | C09J 201/00 361/767 |
| 2018/0366434 A1* | 12/2018 | McClain | H01L 24/81 |
| 2019/0148335 A1* | 5/2019 | Bayless | H01L 23/562 257/798 |
| 2019/0378746 A1 | 12/2019 | Kiuchi et al. | |

FOREIGN PATENT DOCUMENTS

| | | | |
|---|---|---|---|
| JP | 2013243311 A | 12/2013 | |
| JP | 2017216275 A | 12/2017 | |

* cited by examiner

PROCESSING METHOD AND THERMOCOMPRESSION BONDING METHOD FOR WORKPIECE

BACKGROUND OF THE INVENTION

Field of the Invention

The present invention relates to a processing method for processing a workpiece and also to a thermocompression bonding method for thermocompression bonding a sheet on a workpiece.

Description of the Related Art

In a fabrication process of device chips, a plurality of intersecting streets (scheduled division lines) is set on a front side of a substrate such as a semiconductor wafer, a package substrate, a ceramic substrate, or a glass substrate, and devices are disposed in the respective regions defined by the streets on the front side of the substrate. When the substrate with the devices disposed thereon is divided along the streets, individual device chips can be formed. This division of the substrate is performed using, for example, a cutting machine including a cutting blade that can cut the substrate along the streets or a processing machine such as a laser processing machine that can process the substrate with a laser beam along the streets. Upon loading a workpiece such as a substrate onto the processing machine, an annular frame is provided beforehand, a tape is bonded to the annular frame so as to close an opening of the frame, and the tape is then bonded to the workpiece to form a frame unit. The tape has an adhesive layer provided with adhesiveness. The tape is therefore bonded to the frame and the workpiece by an adhesion force of the adhesive layer.

In the form of the frame unit, the workpiece is loaded onto the processing machine and is processed by the processing machine. The individual device chips formed by the division of the workpiece are then held on the tape. Subsequently, the device chips are separated from the tape and are mounted on predetermined mounting objects. After separating the device chips from the tape, portions of the adhesive layer of the tape may remain on the device chips and may become a cause of occurrence of a failure in at least some of the device chips. To prevent the generation of such residues of an adhesive layer, a sheet has therefore been proposed (see, for example, JP 2013-243311 A). The sheet has no adhesive layer at a region corresponding to a device region in which devices are formed, on a front side of a workpiece and includes an adhesive layer at a region corresponding to an outer peripheral margin at an outer periphery of the device region. When this sheet is used, the sheet is brought into close contact with the device region of the workpiece to form a frame unit.

In certain instances, upon processing a workpiece, a tape may be bonded to a front side of the workpiece where devices are formed, and the workpiece may then be processed from its back side. In this case, the workpiece is upwardly exposed on its back side when a frame unit is held on a holding table of a processing machine. To confirm a position on the workpiece where the workpiece is to be processed, a device to enable imaging of the front side of the workpiece from below through the holding table has hence been proposed (see, for example, JP 2010-82644 A).

SUMMARY OF THE INVENTION

Upon processing a workpiece having projections and depressions on a front side thereof, residues of an adhesive layer do not remain on device chips if a frame unit is formed using a sheet having no adhesive layer at a region corresponding to a device region of the workpiece. On the other hand, the front side of the workpiece does not come into close contact with the sheet at the depressions thereof so that spaces are formed between the sheet and the workpiece. As the workpiece is not sufficiently supported on a lower side (the front side) thereof in this state, chips and cracks may be formed on and in the device chips if the workpiece is cut in this state. Further, the device chips formed by the division of the workpiece may separate from the sheet and scatter around. Furthermore, a cutting fluid that contains cutting debris generated by the cutting may penetrate into the spaces between the sheet and the workpiece and may contaminate the front side of the workpiece.

When the sheet is brought into close contact with a workpiece having projections and depressions on a front side thereof, steps that simulate the projections and depressions of the workpiece are generated on one side of the sheet, i.e., the side to be held on a holding table (the side to remain out of contact with the workpiece). In certain instances, satinizing may be applied beforehand to the one side of the workpiece, i.e., the side to remain out of contact with the workpiece. Even if an attempt is made to observe the front side of the workpiece through the sheet from a side of the holding table with the workpiece held thereon, the propagation of light is hence disturbed by the sheet to result in the acquisition of an unclear captured image and a processing unit not positioned appropriately.

The present invention therefore has as objects thereof the provision of a processing method and thermocompression bonding method for a workpiece which can bring the workpiece and a sheet into close contact with each other and can also planarize one side of the sheet, the side being out of contact with the workpiece.

In accordance with a first aspect of the present invention, there is provided a processing method for a workpiece which includes a stacking step of stacking a sheet and a flat plate on a front side of the workpiece to form a stack in which the sheet is held between the workpiece and the flat plate, a thermocompression bonding step of thermocompression bonding the sheet to the workpiece while planarizing the sheet with the flat plate by heating the sheet and applying an external force to the stack, a holding step of holding the workpiece via the sheet by a holding table, after performing the thermocompression bonding step, the holding table having a transparent portion with a transparent member included therein, an alignment step of performing an alignment by imaging the workpiece through the transparent portion and the sheet, after performing the holding step, and a processing step of processing the workpiece by a processing unit after performing the alignment step.

Preferably, the workpiece has projections and depressions on the front side, the sheet has a thickness greater than a difference in height between the projections and the depressions, the sheet is stacked on the front side of the workpiece in the stacking step, the sheet is thermocompression bonded to the front side of the workpiece in the thermocompression bonding step, the workpiece is held on the front side thereof via the sheet by the holding table in the holding step, and the workpiece is processed from a back side thereof by the processing unit in the processing step.

More preferably, the workpiece has, on the front side thereof, a device region in which a plurality of devices is formed, and the sheet has an adhesive layer at a region not corresponding to the device region of the workpiece.

In accordance with a second aspect of the present invention, there is provided a thermocompression bonding method for thermocompression bonding a sheet to a workpiece which includes a stacking step of stacking the sheet and a flat plate on a front side of the workpiece to form a stack in which the sheet is held between the workpiece and the flat plate and a thermocompression bonding step of thermocompression bonding the sheet to the workpiece while planarizing the sheet with the flat plate by heating the sheet and applying an external force to the stack, after performing the stacking step.

In the processing method and thermocompression bonding method according to the first and second aspects of the present invention, a sheet and a flat plate are stacked on a workpiece and the sheet is thermocompression bonded to the workpiece. As a result, the side of the sheet, i.e., the side out of contact with the workpiece, is planarized. Moreover, even if projections and depressions are formed on the front side of the workpiece, spaces between the sheet and the workpiece are filled up by the sheet, and the workpiece and the sheet are brought into firm and close contact with each other.

The present invention therefore provides a processing method and thermocompression bonding method for a workpiece, which can bring a workpiece and a sheet into close contact with each other and can also planarize one side of the sheet, i.e., the side out of contact with the workpiece.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

With reference to the attached drawings, a description will be made about an embodiment of the respective aspects of the present invention. In a processing method and thermocompression bonding method according to the present embodiment for a workpiece, a sheet and a flat plate are stacked on the workpiece to form a stack with the sheet held between the workpiece and the flat plate. The sheet is then thermocompression bonded to the workpiece while the sheet is planarized with the flat plate by being heated and an external force being applied to the stack.

Figure 1:
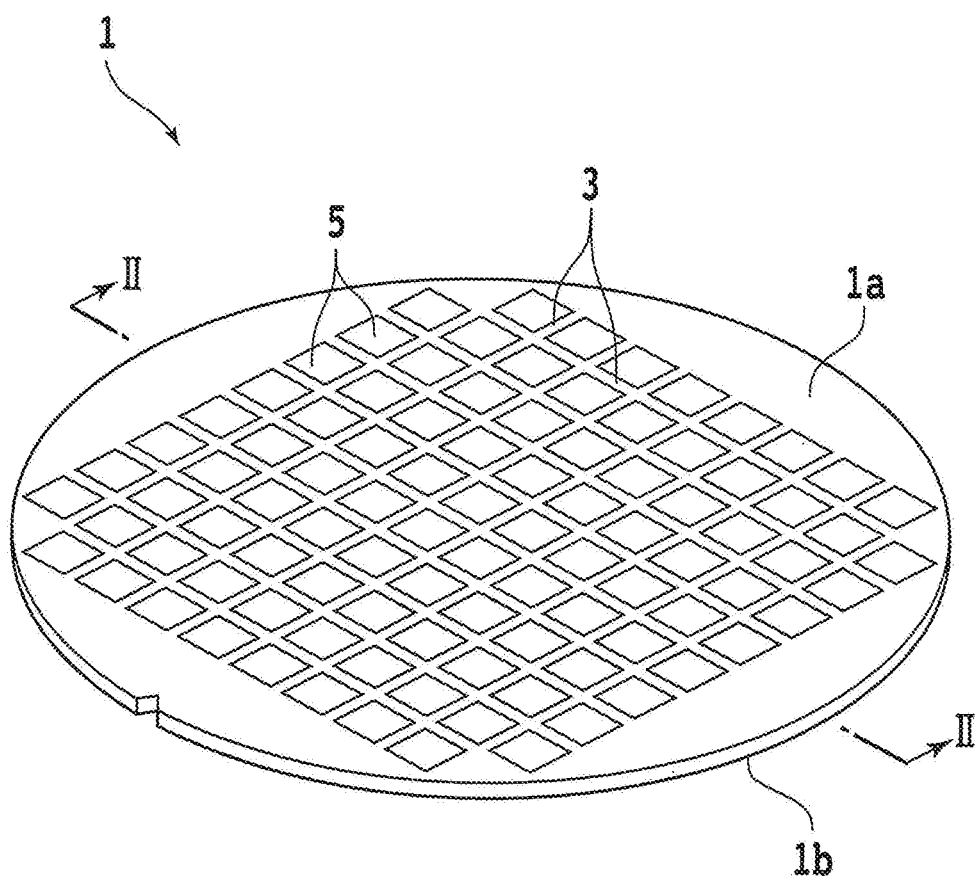
FIG. 1 is a perspective view schematically depicting a workpiece.

Referring to FIG. 1, a description will first be made about the workpiece. The workpiece 1 is, for example, a wafer made from a material such as silicon, silicon carbide (SiC), or a further semiconductor or a complex oxide such as lithium tantalite (LT) or lithium niobate (LN). As an alternative, the workpiece 1 is a substrate made from sapphire, glass, quartz, or ceramic or a package substrate carrying thereon devices covered with resin. On a front side 1a of the workpiece 1, a plurality of intersecting streets 3 is set, and devices 5 such as integrated circuits (ICs) or large scale integrations (LSIs) are disposed in the respective regions defined by the streets 3. When the workpiece 1 is divided along the streets 3, individual device chips can be formed.

Figure 2:
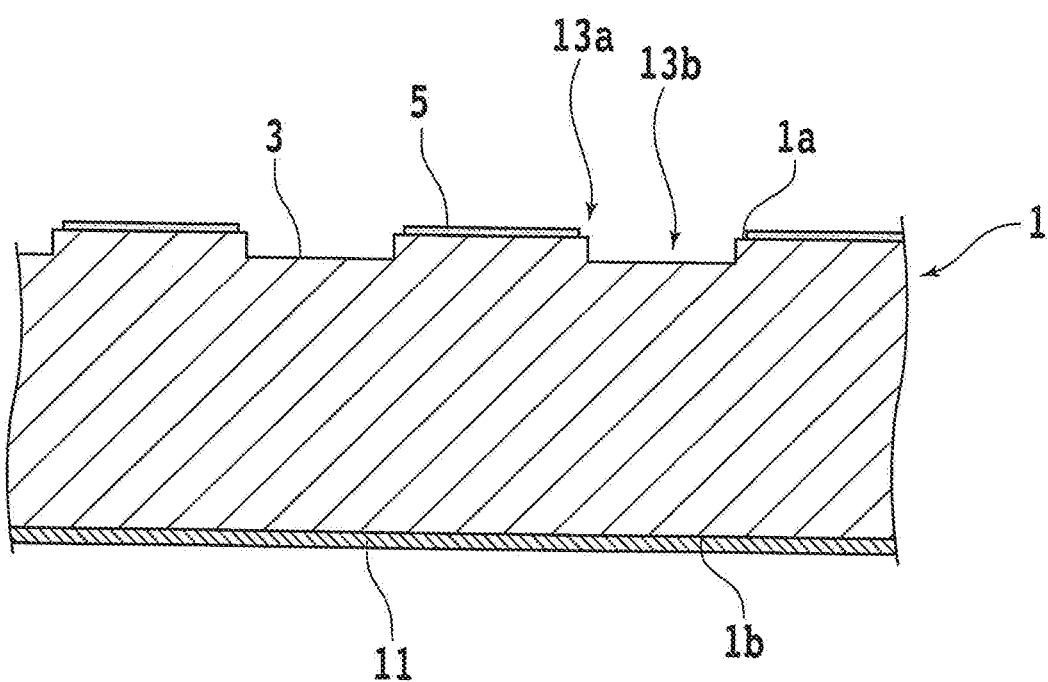
FIG. 2 is a fragmentary cross-sectional view taken in the direction of arrows II-II of FIG. 1 and schematically depicting, on an enlarged scale, the workpiece having projections and depressions on a front side thereof.

The workpiece 1 may have projections and depressions on the front side 1a. FIG. 2 is a fragmentary cross-sectional view taken in the direction of arrows II-II of FIG. 1 and schematically depicting the workpiece 1 having the projections and depressions on the front side 1a. For example, the devices 5 are formed in the regions defined by the streets 3 on the front side 1a of the workpiece 1. The workpiece 1 has, for example, projecting portions 13a on the front side 1a and depressing portions 13b around the projecting portions 13a. In the subsequent figures, the projecting portions 13a and the depressing portions 13b on the front side 1a of the workpiece 1 are omitted. As depicted in FIG. 2, a metal layer 11 may be formed on a back side 1b of the workpiece 1. The metal layer 11 functions, for example, as electrodes and heat sinks for device chips to be formed by division of the workpiece 1. If the metal layer 11 is formed on the back side 1b of the workpiece 1, however, a difficulty arises in specifying the position of each street 3 on the front side 1a by imaging the workpiece 1 from the back side 1b with an infrared camera or the like upon processing the workpiece 1 from the back side 1b.

Figure 3:
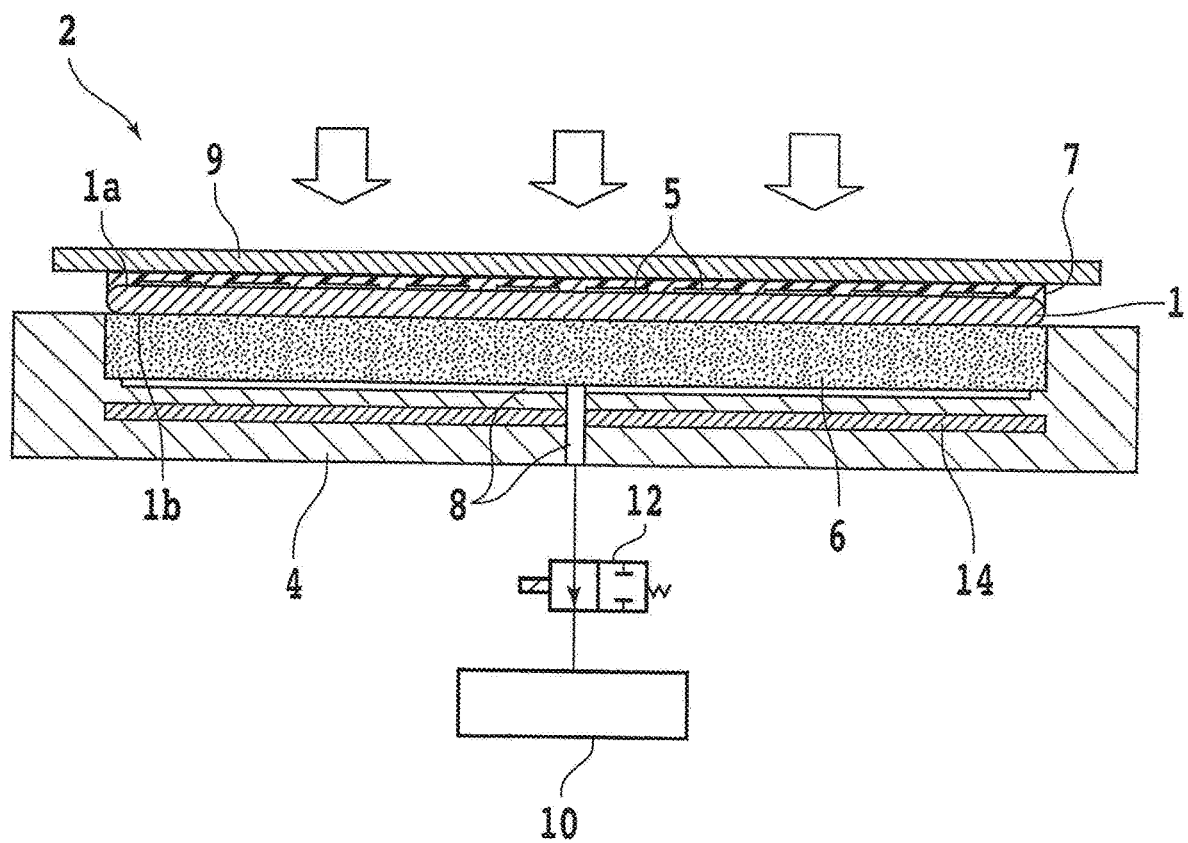
FIG. 3 is a cross-sectional view schematically depicting an example of a thermocompression bonding machine and an example of a thermocompression bonding step.

Referring to FIG. 3, a description will next be made about the sheet. FIG. 3 schematically presents a cross-sectional view of the sheet 7 in the state in which the sheet 7 is held between the workpiece 1 and the flat plate 9. The sheet 7 is made from a thermoplastic resin that softens with heat, and is transparent or translucent to visible light. The sheet 7 is, for example, a polyvinyl chloride sheet, a polyolefin sheet, or a polyester sheet. Examples of the polyolefin sheet include a polyethylene sheet, a polypropylene sheet, a polystyrene sheet, and the like. One side of the sheet 7 where the sheet 7 comes into contact with the workpiece 1 is planar. On the other hand, an opposite side of the sheet 7 where the sheet 7 remains out of contact with the workpiece 1 may be subjected to satinizing beforehand. However, the present embodiment is not limited to such surface conditions, and the sheet 7 may be planer on both sides thereof or may have been subject to satinizing treatment on both sides thereof.

The sheet 7 has a planar shape sufficient to cover the workpiece 1. For example, the sheet 7 can be set to have a substantially equal planar shape as the front side 1*a* of the workpiece 1. The sheet 7 may have an adhesive layer at a region that does not corresponds to a device region of the workpiece 1 where the devices 5 are formed. In other words, the sheet 7 may have an adhesive layer at a region corresponding to an outer peripheral margin region that surrounds the device region of the workpiece 1. Further, the sheet 7 may have a greater planar shape than the front side 1*a* of the workpiece 1. In this case, the formation of an adhesive layer 15 (see FIG. 4A, etc.) on an outer peripheral portion of the sheet 7 enables the sheet 7 to be bonded to an annular frame 17 (see FIG. 4A, etc.) via the adhesive layer 15. Here, the frame 17 has an opening of a diameter greater than that of the workpiece 1 and is formed, for example, with a material such as a metal. If the sheet 7 does not include the adhesive layer 15, the sheet 7 may be thermocompression bonded together with the workpiece 7 to the frame 17.

The sheet 7 itself does not have adhesiveness and cannot be bonded to the workpiece 1 at room temperature. However, the sheet 7 can be brought into close contact with the workpiece 1 if the workpiece 1 and the sheet 7 are brought into contact with each other, the sheet 7 is heated and softened, and a predetermined external force is applied to the sheet 7 and the workpiece 1. In other words, the sheet 7 can be thermocompression bonded to the workpiece 1. For bringing the sheet 7 into close contact with the front side 1*a* of the workpiece 1, the sheet 7 preferably has a thickness greater than the difference in height between the projections and depressions of the workpiece 1.

Referring to FIG. 3, a description will next be made about the flat plate 9 to be used upon the thermocompression bonding of the sheet 7 to the workpiece 1. The flat plate 9 is a plate-shaped member that is planar on both sides thereof. The flat plate 9 has a size sufficient to cover the sheet 7 in its entirety and has, for example, a similar planar shape as the sheet 7. Upon heating and softening the sheet 7, the flat plate 9 in contact with the sheet 7 is also heated. A material, which has higher hardness than the sheet 7 during the heated state, is used for the flat plate 9. In other words, a material that has a higher softening point, at which softening begins, or a higher melting point than the sheet 7 is used for the flat plate 9. For the flat plate 9, a resin such as polyethylene terephthalate (PET), glass, metal, or the like is used, for example.

A description will next be made about a thermocompression bonding machine (heating machine) to be used in the processing method and thermocompression bonding method according to the present embodiment. FIG. 3 is a cross-sectional view schematically depicting an example of the thermocompression bonding machine (heating machine). The thermocompression machine 2 depicted in FIG. 2 is a table-shaped machine that supports the workpiece 1 thereon.

The thermocompression bonding machine 2 includes a table frame 4 and a porous member 6. The table frame 4 is made from a metal material represented by stainless steel and has a recessed portion formed in an upper wall thereof. The porous member 6 is accommodated in the recessed portion of the table frame 4. The porous member 6 has a similar diameter as the workpiece 1. Inside the table frame 4, a suction line 8 is formed in communication with the porous member 6. In other words, the suction line 8 communicates at an end thereof to the porous member 6. To a side of an opposite end of the suction line 8, a suction source 10 is connected via a selector valve 12. When the workpiece 1 is placed on the porous member 6 and the selector valve 12 is operated to connect the suction source 10 to the suction line 8, a negative pressure produced by the suction source 10 acts on the workpiece 1 through the suction line 8 and the porous member 6, whereby the workpiece 1 is held under suction on the thermocompression bonding machine 2. Inside the table frame 4, a heater 14 is also disposed to heat the workpiece 1 placed on the thermocompression bonding machine 2. The heater 14 is, for example, an electric heating wire. When the workpiece 1 is held under suction on the thermocompression bonding machine 2, the sheet 7 and the flat plate 9 are stacked on the workpiece 1, and the heater 14 is activated, the sheet 7 is heated through the workpiece 1. When the heater 14 is activated to raise the temperature of the sheet 7 to its softening point or higher and the flat plate 9 is pressed from above, the sheet 7 and the workpiece 1 can be thermocompression bonded.

Figure 4A:
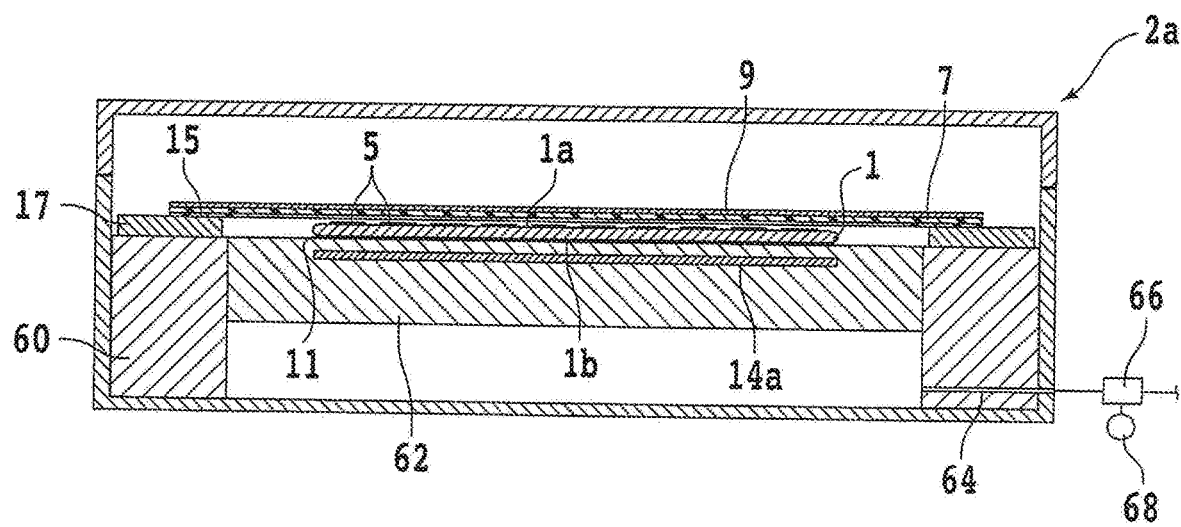
FIG. 4A is a cross-sectional view schematically depicting another example of the thermocompression bonding machine.
Figure 4B:
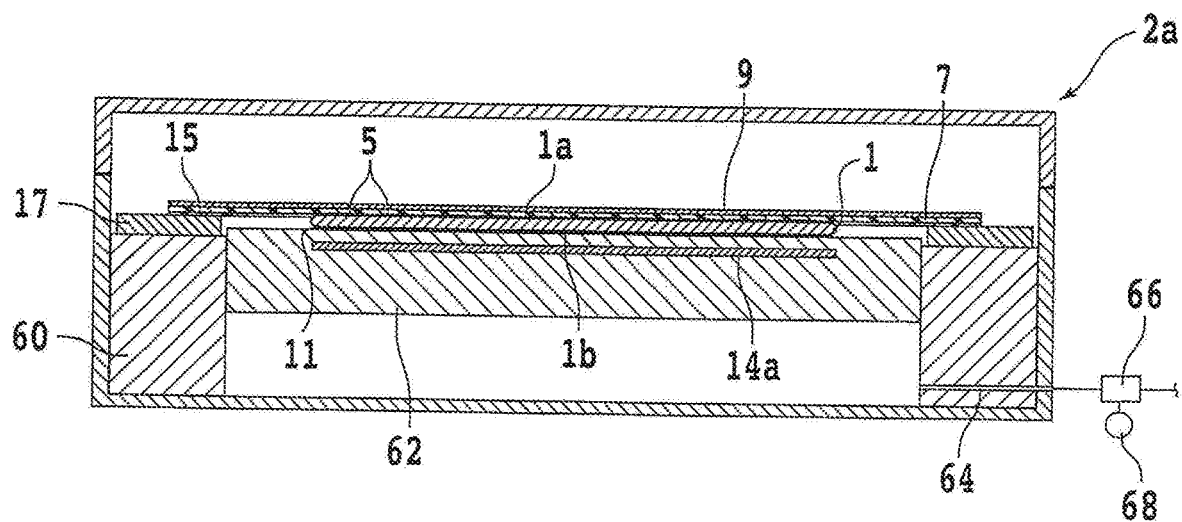
FIG. 4B is a cross-sectional view schematically depicting another example of the thermocompression bonding step.

The thermocompression bonding machine for use in the processing method and thermocompression bonding method according to the present embodiment is not limited to the one exemplified above. FIGS. 4A and 4B schematically depict a cross sectional view of a thermocompression bonding machine 2*a* of another example. A description will next be made about the thermocompression bonding machine 2*a* depicted in FIGS. 4A and 4B.

The thermocompression bonding machine 2*a* has a housing that can internally form a hermetically closed space, and includes a cylindrical frame support base 60 and an up/down table 62 inside the housing. The frame support base 60 supports the frame 17, and the up/down table 62 is fitted in an opening of the frame support base 60. The up/down table 62 is movable up and down relative to the frame support base 60. Inside the up/down table 62, a heater 14*a* is assembled. By the frame support base 60 and the up/down table 62, the internal space of the housing of the thermocompression bonding machine 2*a* is isolated into an upper mounting space for the workpiece 1 and a lower pressurization space. Through a lower part of the frame support base 60, a duct line 64 is formed to communicate an inside and an outside of the cylindrical frame support base 60. Through the housing of the thermocompression bonding machine 2*a*, a through-hole is formed at a position corresponding to the duct line 64 in the frame support base 60. The duct line 64 communicates at an end thereof to the pressurization space inside the housing, and a selector valve 66 is connected to an opposite end of the duct line 64. The selector valve 66 has a function of selectively connecting one of an external space of the thermocompression bonding machine 2*a* or a compressor unit 68 to the duct line 64. The compressor unit 68 is, for example, an air compressor.

Upon using the thermocompression bonding machine 2*a*, the workpiece 1, the frame 17, the sheet 7, and the flat plate 9 are carried into the mounting space inside the housing. The workpiece 1 is then placed on the up/down table 62 with the back side 1*b* directed downward, and the frame 17 is placed on the frame support base 60. Further, the sheet 7 and the flat plate 9 are stacked on the frame 17 and the workpiece 1. The selector valve 66 is then operated to connect the compressor unit 68 to the pressurization space of the thermocompression bonding machine 2*a* through the vent line 64, whereby the pressure in the pressurization space is raised. As depicted in FIG. 4B, the up/down table 62 then ascends to bring the workpiece 1 into close contact on the front side 1*a* thereof with the sheet 7. When the heater 14a is activated to heat the sheet 7 via the workpiece 1 and to raise the temperature of the sheet 7 to the softening point or higher while the workpiece 1 is pressed toward the sheet 7 by the up/down table 62, the sheet 7 and the workpiece 1 can be thermocompression bonded to each other. Thereafter, when the selector valve 66 is operated to connect the pressurization space of the thermocompression bonding machine 2a and the external space of the thermocompression bonding machine 2a together, the pressure in the pressurization space is lowered so that the up/down table 62 descends. As the workpiece 1 has already been thermocompression bonded to the sheet 7 at this time, the workpiece 1 is brought into a floating state relative to the up/down table 62.

Figure 5A:
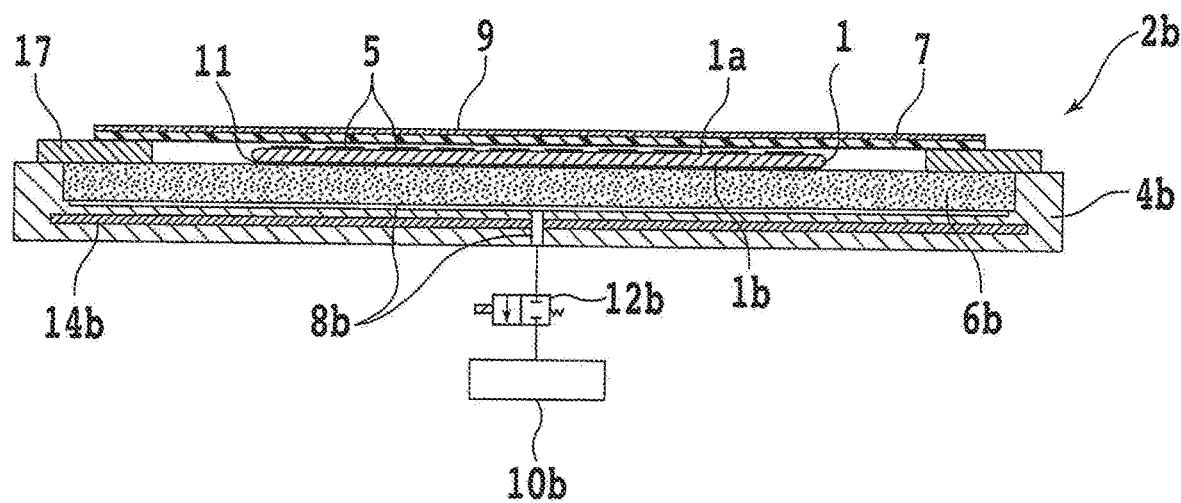
FIG. 5A is a cross-sectional view schematically depicting a further example of the thermocompression bonding machine.
Figure 5B:
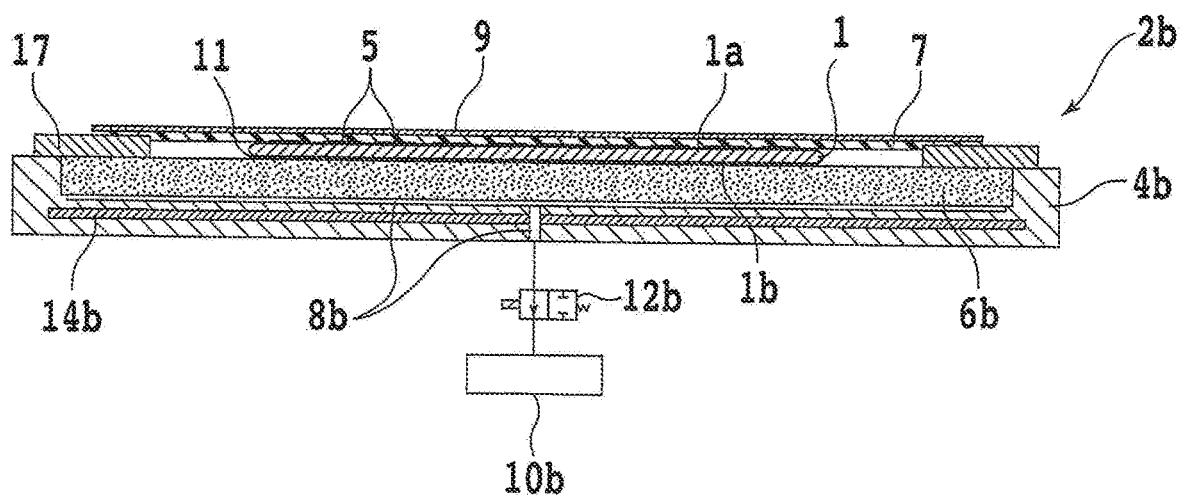
FIG. 5B is a cross-sectional view schematically depicting a further example of the thermocompression bonding step.

The thermocompression bonding machine for use in the processing method and thermocompression bonding method according to the present embodiment is not limited to those exemplified above. FIGS. 5A and 5B schematically present cross-sectional views of a thermocompression bonding machine 2b of a further example. A description will next be made about the thermocompression bonding machine 2b depicted in FIGS. 5A and 5B. The thermocompression bonding machine 2b includes a table frame 4b and a porous member 6b. The porous member 6b has a diameter which is greater than an inner diameter but smaller than an outer diameter of the frame 17 to be integrated with the workpiece 1. Inside the table frame 4b, a suction line 8b is formed in communication with the porous member 6b. On a side of an opposite end of the suction line 8, a suction source 10b is connected via a selector valve 12b. Inside the table frame 4b, a heater 14b is disposed.

With the back side 1b of the workpiece 1 directed downward, the workpiece 1 and the frame 17 are placed on the thermocompression bonding machine 2b, and the sheet 7 and the flat plate 9 are disposed above the workpiece 1 and the frame 17. At this time, the workpiece 1 and the sheet 7 may be out of contact with each other. The heater 14b is next activated to heat the frame 17 and the workpiece 1. As a consequence, heat is transmitted from the frame 17 to the sheet 7, and the sheet 7 is heated. At this time, the temperature of the sheet 7 is raised to the softening point or higher. Thereafter, when the selector valve 12b is operated to bring the suction source 10b into communication with the suction line 8b as depicted in FIG. 5B, the space surrounded by the thermocompression bonding machine 2b, the frame 17, and the sheet 7 is depressurized. In this case, the flat plate 9 is downwardly pressed by a difference in pressure between an inside and an outside of the space, whereby the sheet 7 enters an opening of the frame 17, comes into close contact with the front side 1a of the workpiece 1, and is thermocompression bonded to the workpiece 1.

The porous member 6b of the thermocompression bonding machine 2b may have a diameter greater than the outer diameter of the frame 17. If this is the case, a sheet 7 having a dimeter greater than that of the porous member 6b is provided so that, upon placing the sheet 7 over the workpiece 1 and the frame 17, the porous member 6b is covered at the entire area of an upper surface thereof by the sheet 7. As a consequence, the space surrounded by the thermocompression bonding machine 2b and the sheet 7 can be depressurized by a negative pressure produced by the suction source 10b. After the sheet 7 is thermocompression bonded to the frame 17, the sheet 7 is cut off at an area where the sheet 7 overlaps the frame 17, whereby a frame unit can be formed. In the processing method and thermocompression method according to the present embodiment, thermocompression bonding machines other than the thermocompression bonding machines 2, 2a, and 2b may also be used.

A description will next be made about a processing machine for use in the processing method according to the present embodiment. When the workpiece 1 is processed and divided along the streets 3, individual device chips can be formed. The processing machine is a processing machine that processes the workpiece 1 along the streets 3. Upon processing the workpiece 1 by the processing machine, the workpiece 1 is imaged by an imaging unit of the processing machine to confirm the position of each street 3. In the processing machine, an alignment is then performed to adjust the position of a processing unit so that the workpiece 1 can be processed along the street 3. The processing machine that processes the workpiece 1 is, for example, a laser processing machine that applies a laser beam onto the workpiece 1. The laser processing machine applies a laser beam, which has a wavelength absorbable to the workpiece 1 (a wavelength that the workpiece 1 can absorb), onto the workpiece 1 to perform ablation processing, whereby processed grooves can be formed in the workpiece 1. As an alternative, the laser processing machine focuses a laser beam, which has a wavelength transmissible through the workpiece 1 (a wavelength that can transmit through the workpiece 1), inside the workpiece 1 to form modified layers in the workpiece 1. When an external force is applied to the workpiece 1 in which the modified layers have been formed, cracks occur extending upward and downward from the modified layers so that the workpiece 1 is divided.

Figure 6:
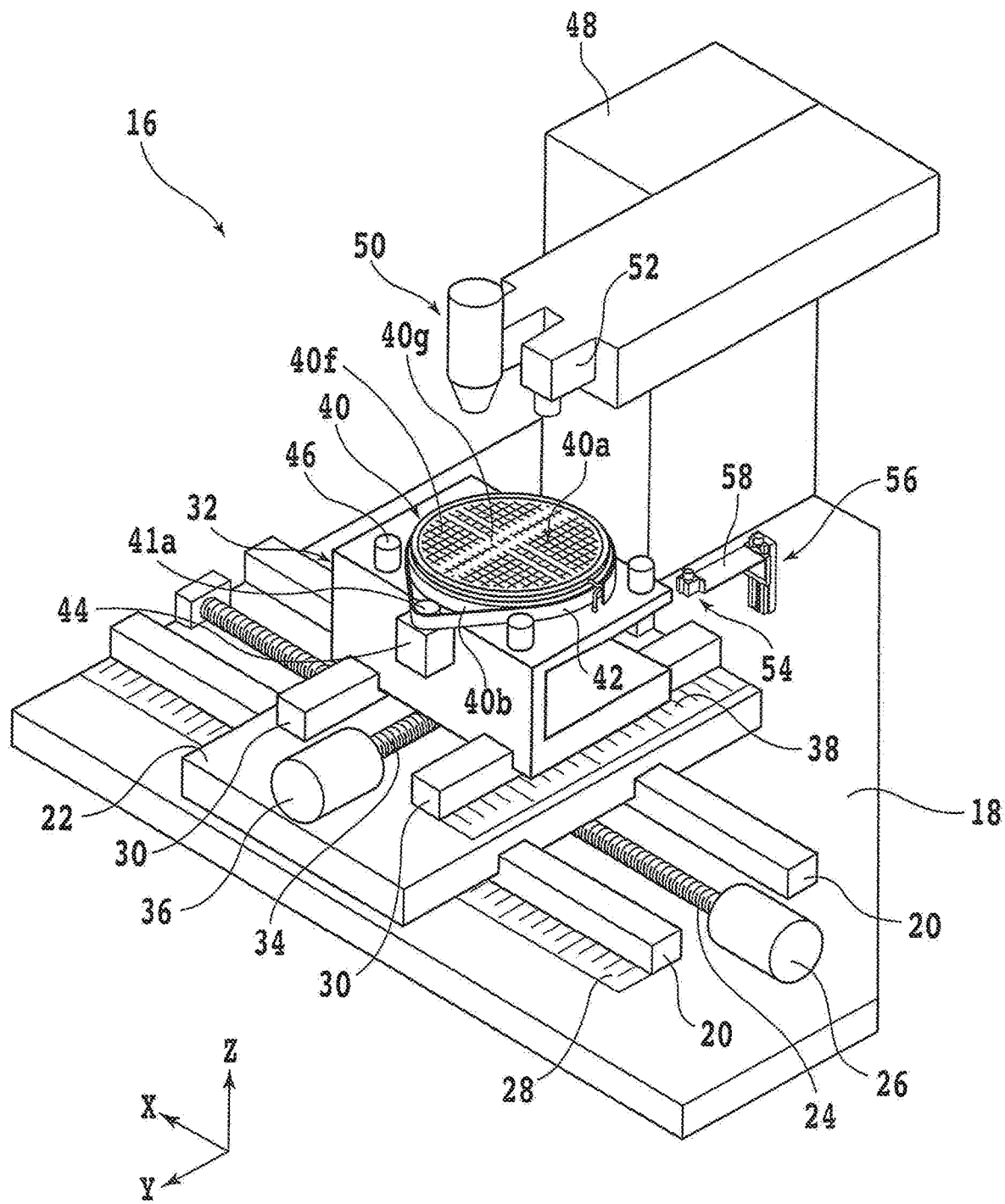
FIG. 6 is a perspective view schematically depicting a laser processing machine.

A description will be made about the laser processing machine as an example of the processing machine that processes the workpiece 1. FIG. 6 is a perspective view schematically depicting the laser processing machine 16. An X-axis direction (processing feed direction), a Y-axis direction (indexing feed direction), and a Z-axis direction (height direction), which will be referred to in the following description, are perpendicular to one another. As depicted in FIG. 6, the laser processing machine 16 includes a bed 18 to support individual constituent elements.

On an upper surface of the bed 18, a pair of X-axis guide rails 20 is fixed substantially in parallel with the X-axis direction. To the X-axis guide rails 20, an X-axis moving table 22 is slidably attached. On a side of a lower surface of the X-axis moving table 22, nut portions (not depicted) are disposed, and in the nut portions, an X-axis ball screw 24 is threaded substantially in parallel with the X-axis guide rails 20. To an end portion of the X-axis ball screw 24, an X-axis pulse motor 26 is connected. When the X-axis ball screw 24 is rotated by the X-axis pulse motor 26, the X-axis moving table 22 moves in the X-axis direction along the X-axis guide rails 20. At a position adjacent to the X-axis guide rails 20, an X-axis scale 28 is arranged for use upon detecting the position of the X-axis moving table 22 in the X-axis direction.

Figure 7:
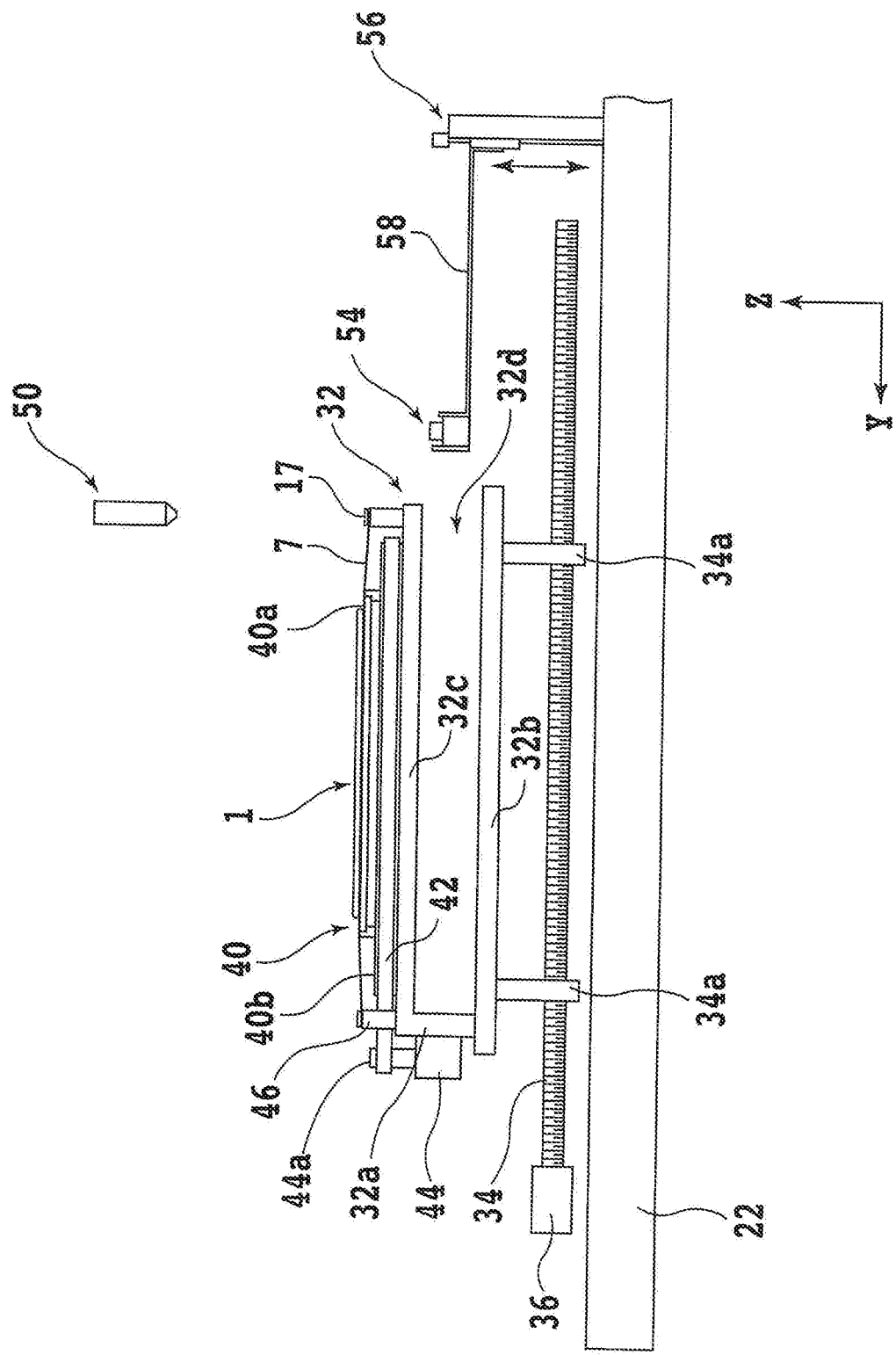
FIG. 7 is a cross-sectional view schematically depicting the laser processing machine and the workpiece.

On an upper surface of the X-axis moving table 22, a pair of Y-axis guide rails 30 is fixed substantially in parallel with the Y-axis direction. To the Y-axis guide rails 30, a table base 32 is slidably attached. FIG. 7 schematically presents a cross-sectional view of the table base 32. On a side of a lower surface of a bottom wall portion 32b of the table base 32, nut portions 34a are disposed, and in the nut portions 34a, a Y-axis ball screw 34 is threaded substantially in parallel with the Y-axis guide rails 30. To an end portion of the Y-axis ball screw 34, a Y-axis pulse motor 36 is connected. When the Y-axis ball screw 34 is rotated by the Y-axis pulse motor 36, the table base 32 moves in the Y-axis direction along the Y-axis guide rails 30. At a position adjacent to the Y-axis guide rails 30, a Y-axis scale 38 is arranged for use upon detecting the position of the table base 32 in the Y-axis direction.

Figure 8:
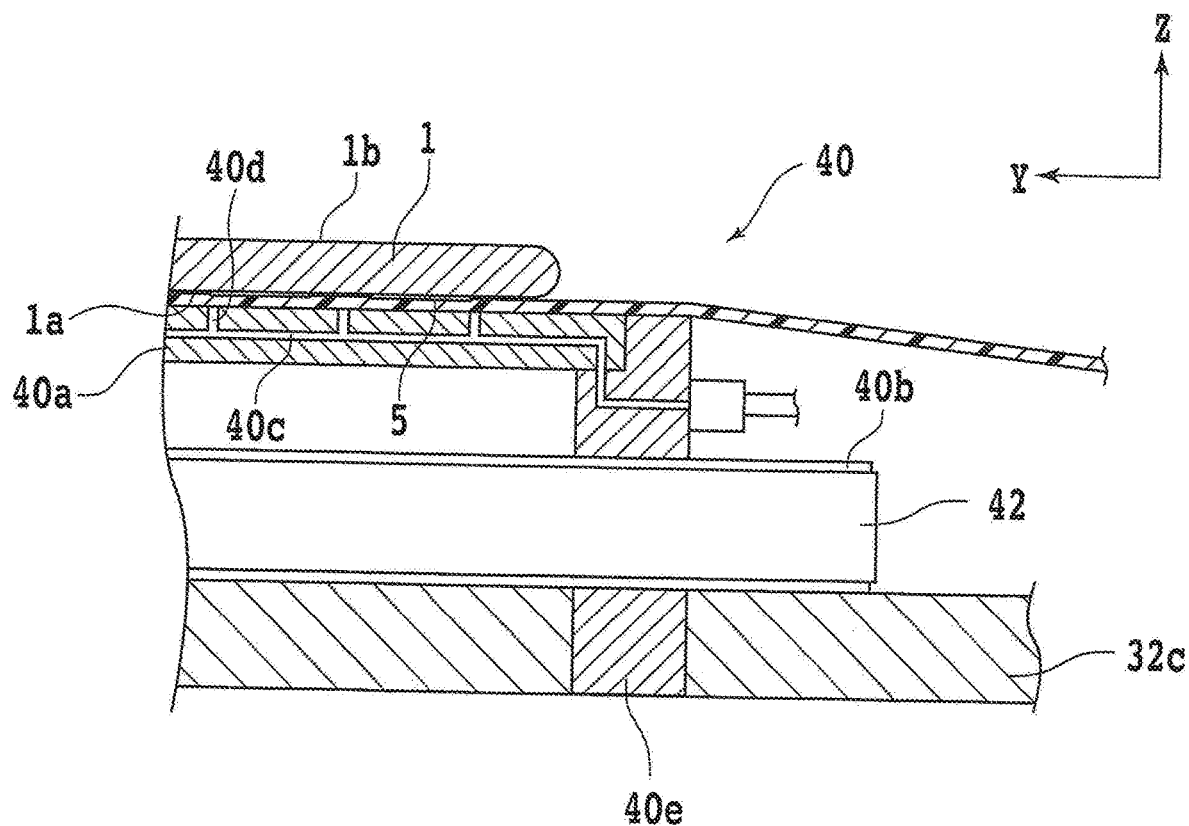
FIG. 8 is a fragmentary cross-sectional view schematically depicting, on an enlarged scale, the laser processing machine and the workpiece.

To an end of the bottom wall portion 32b of the table base 32 in the Y-axis direction, a side wall portion 32a having a rectangular shape as viewed from the Y-axis direction is connected at a lower end thereof. To an upper end of the side wall portion 32a, a top wall portion 32c having a similar rectangular shape as the bottom wall portion 32b as viewed from the Z-axis direction is connected at an end thereof in the Y-axis direction. Between the bottom wall portion 32b and the top wall portion 32c, a space 32d is therefore formed communicating to an outside at an opposite end in the Y-axis direction and both ends in the X-axis direction. On a side of an upper surface of the top wall portion 32c of the table base 32, a holding table (chuck table) 40 is disposed for use upon holding the workpiece 1. The holding table 40 is supported on the top wall portion 32c of the table base 32 in a manner such that the holding table 40 can rotate about an axis of rotation which is substantially parallel to the Z-axis direction. As depicted in FIG. 8, an annular fitted hole is formed in the top wall portion 32c, and an annular fitting protrusion 40e is slidably fitted in the fitted hole. Therefore, the fitting protrusion 40e is caused to slide relative to the fitted hole when the holding table 40 is rotated.

The holding table 40 includes, as a top wall, a disk-shaped holding member 40a that holds the workpiece 1 under suction. The holding member 40a is made of a transparent material which transmits visible light, such as soda glass, borosilicate glass, or silica glass. The holding member 40a has a suction portion 40f and a transparent portion 40g surrounded by the suction portion 40f. In the laser processing machine 16 depicted in FIG. 6, the transparent portion 40g is formed in a cross shape having a portion extending in the X-axis direction and a portion extending in the Y-axis direction.

Inside the holding member 40a, a suction line 40c (see FIG. 8) is arranged for use in attracting the workpiece 1 under suction. In the suction portion 40f of the holding member 40a, plural suction grooves 40d (see FIG. 8) are formed in communication with the suction line 40c. To a side of an outer end of the suction line 40c, a suction source (not depicted) with an ejector and the like included therein is connected. The transparent portion 40g of the holding member 40a is transparent from an upper surface to a lower surface. Accordingly, the workpiece 1 or the like placed on the side of the upper surface of the holding member 40a can be imaged from a side of the lower surface of the holding member 40a. In other words, the holding member 40a described in the present embodiment is configured of a transparent member in its entirety. However, the holding member 40a is only required to be transparent from the upper surface to the lower surface at the transparent portion 40g. In other words, the holding member 40a is not required to be configured of a transparent member alone. It is to be noted that through the top wall portion 32c, an opening (not illustrated) is formed at a region which overlaps the transparent portion 40g.

On the side wall portion 32a of the table base 32, a rotary drive source 44 such as a motor is disposed. Around a pulley portion 40b disposed on an outer periphery of the holding table 40 and a pulley 44a connected to a rotary shaft of the rotary drive source 44, a belt 42 is wrapped to transmit a drive power of the rotary drive source 44. By the power transmitted from the rotary drive source 44 via the belt 42, the holding table 40 is rotated about an axis that is substantially parallel to the Z-axis direction. On the top wall portion 32c on an outer side of the holding table 40, plural column-shaped, frame mounting portions 46 are disposed to permit mounting of the annular frame 17. On the frame mounting portions 46, the frame 17 is mounted in a manner such that rotation of the holding table 40 is not obstructed. Using the above-mentioned X-axis pulse motor 26 and Y-axis pulse motor 36 as power sources, the holding table 40 moves together with the X-axis moving table 22 and the table base 32 in the X-axis direction and in the Y-axis direction.

As depicted in FIG. 6, a column-shaped or wall-shaped support structure 48 is disposed on an upper wall of the bed 18. On an upper end of the support structure 48, an arm portion is disposed extending along the Y-axis direction from the upper end to a position above the holding table 40, and a laser processing unit 50 is disposed on a distal end of the arm portion to process the workpiece 1, which is held by the holding table 40, with a laser beam. On the distal end of the arm portion, an upper imaging unit 52 is also fixed adjacent to the laser processing unit 50 to image the workpiece 1 from above.

The laser processing unit 50 is configured from a laser oscillator, optical components, and the like. The laser processing unit 50 applies a laser beam, which has a wavelength absorbable to the workpiece 1 (a wavelength that the workpiece 1 can absorb), onto the workpiece 1 held on the holding table 40 to perform ablation processing, whereby processed grooves can be formed along the streets 3 in the workpiece 1. As an alternative, the laser processing machine 50 focuses a laser beam, which has a wavelength transmissible through the workpiece 1 (a wavelength that can transmit through the workpiece 1), inside the workpiece 1, whereby modified layers can be formed along the streets 3 in the workpiece 1. A description will hereinafter be made about a case where, in the laser processing machine 16, laser processing is performed by the laser processing unit 50 to form modified layers inside the workpiece 1. However, the processing to be performed by the laser processing machine 16 may be ablation processing.

On the upper wall of the bed 18, a column-shaped lifting/lowering support mechanism 56 is also disposed. FIG. 7 schematically presents a side view of the lifting/lowering support mechanism 56. The lifting/lowering support mechanism 56 supports a lower imaging unit 54 so that the lower imaging unit 54 can be lifted or lowered. On a vertically movable plate of the lifting/lowering support mechanism 56, an arm portion 58 which is long in the Y-axis direction is connected on a proximal end thereof, and the lower imaging unit 54 is fixed on a distal end of the arm portion 58. The lower imaging unit 54 includes a camera, which images the workpiece 1 held on the holding table 40, and an illumination unit (not depicted), which applies light onto the workpiece 1.

Figure 9A:
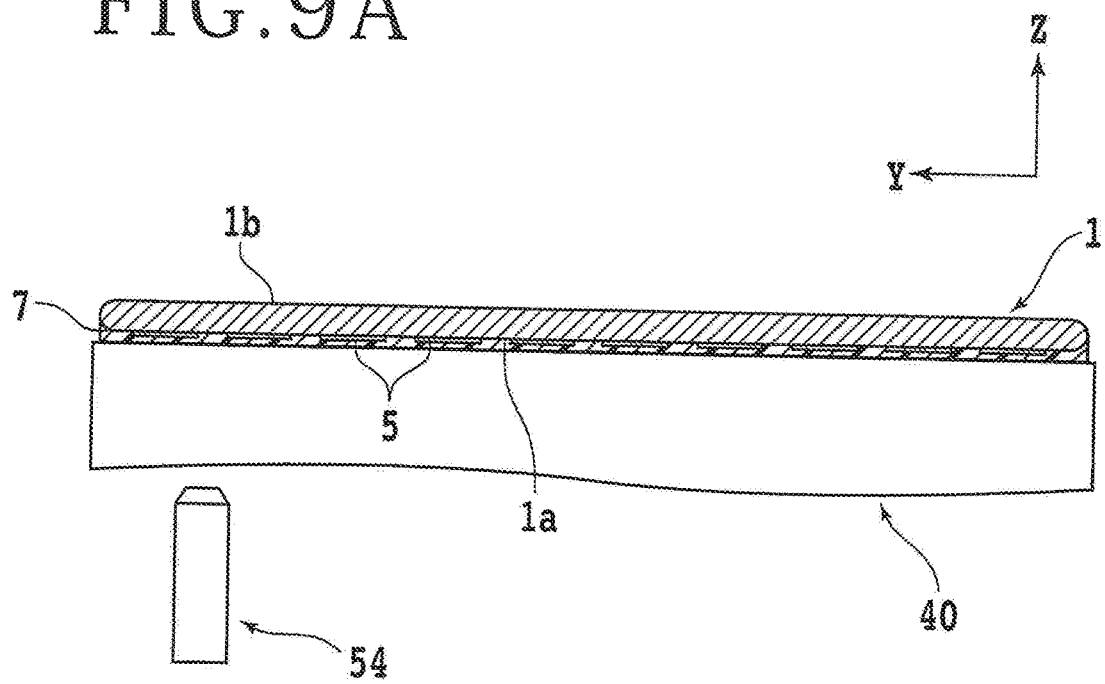
FIG. 9A is a cross-sectional view schematically depicting an example of an alignment step.

When processing the workpiece 1 from the back side 1b by the laser processing machine 16 configured as described above, the sheet 7 bonded to the front side 1a of the workpiece 1 is first brought into contact with the side of the upper surface of the holding member 40a of the holding table 40. A negative pressure produced by the suction source is then applied from the suction grooves 40d communicating to an inner end of the suction line 40c. As a consequence, the workpiece 1 is held on the holding table 40 with the back side 1b being exposed upward. The table base 32 is next moved to insert the lower imaging unit 54 into the space 32d between the bottom wall portion 32b and the top wall portion 32c of the table base 32. The lower imaging unit 54 is then arranged below the transparent portion 40g of the holding member 40a. The positional relationship between the holding member 40a and the lower imaging unit 54 is adjusted in a range suited for imaging the workpiece 1. A cross-sectional view presented in FIG. 9A schematically depicts the positional relationship between the workpiece 1 and the lower imaging unit 54 upon imaging the front side 1a (lower side) of the workpiece 1 by the lower imaging unit 54.

As mentioned above, the transparent portion 40g of the holding member 40a and the sheet 7 are transparent. The front side 1a of the workpiece 1 can therefore be imaged when light is applied upward from the illumination unit of the lower imaging unit 54 toward the workpiece 1 and light reflected by the front side 1a (lower side) of the workpiece 1 is received by a camera of the lower imaging unit 54. If an image obtained by such imaging is used, the position of each street 3 (see FIG. 1) on the workpiece 1 can be specified, and an alignment involving the laser processing unit 50 can be performed.

Figure 9B:
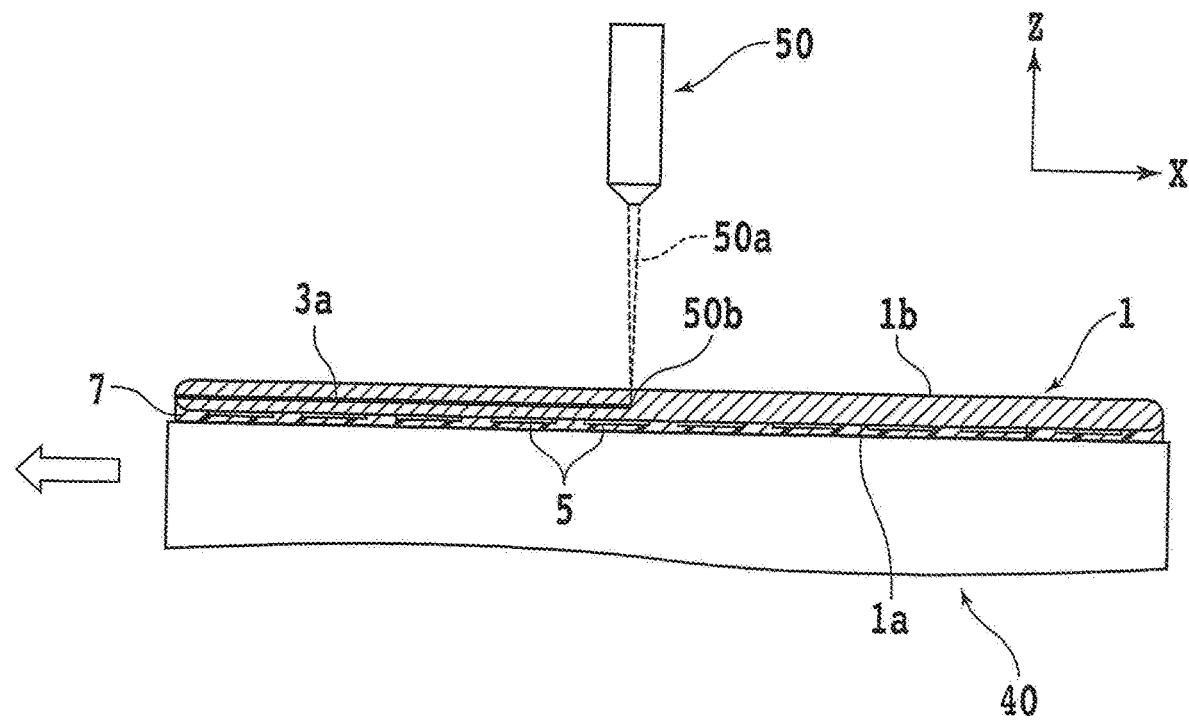
FIG. 9B is a cross-sectional view schematically depicting an example of a processing step.

Subsequently, the workpiece 1 is processed with a laser beam. A cross-sectional view presented in FIG. 9B schematically depicts the positional relationship between the workpiece 1 under laser processing and the laser processing unit 50. First, the X-axis pulse motor 26 and the Y-axis pulse motor 36 are operated to position the laser processing unit 50 above an extension of the street 3 as an object of processing. A focal point 50b is then positioned at a predetermined height position inside the workpiece 1. Subsequently, the holding table 40 is moved along the X-axis direction while a laser beam 50a is applied into the workpiece 1. As a consequence, the workpiece 1 is processed with the laser beam along the street 3 as the object of processing, so that a modified layer 3a can be formed along the street 3 inside the workpiece 1. Such an operation is repeated until the workpiece 1 is processed along all the streets 3 set on the workpiece 1. After completion of the processing of the workpiece 1, the suction holding by the holding table 40 is cancelled, and the workpiece 1 is unloaded from the holding table 40.

Figure 10:
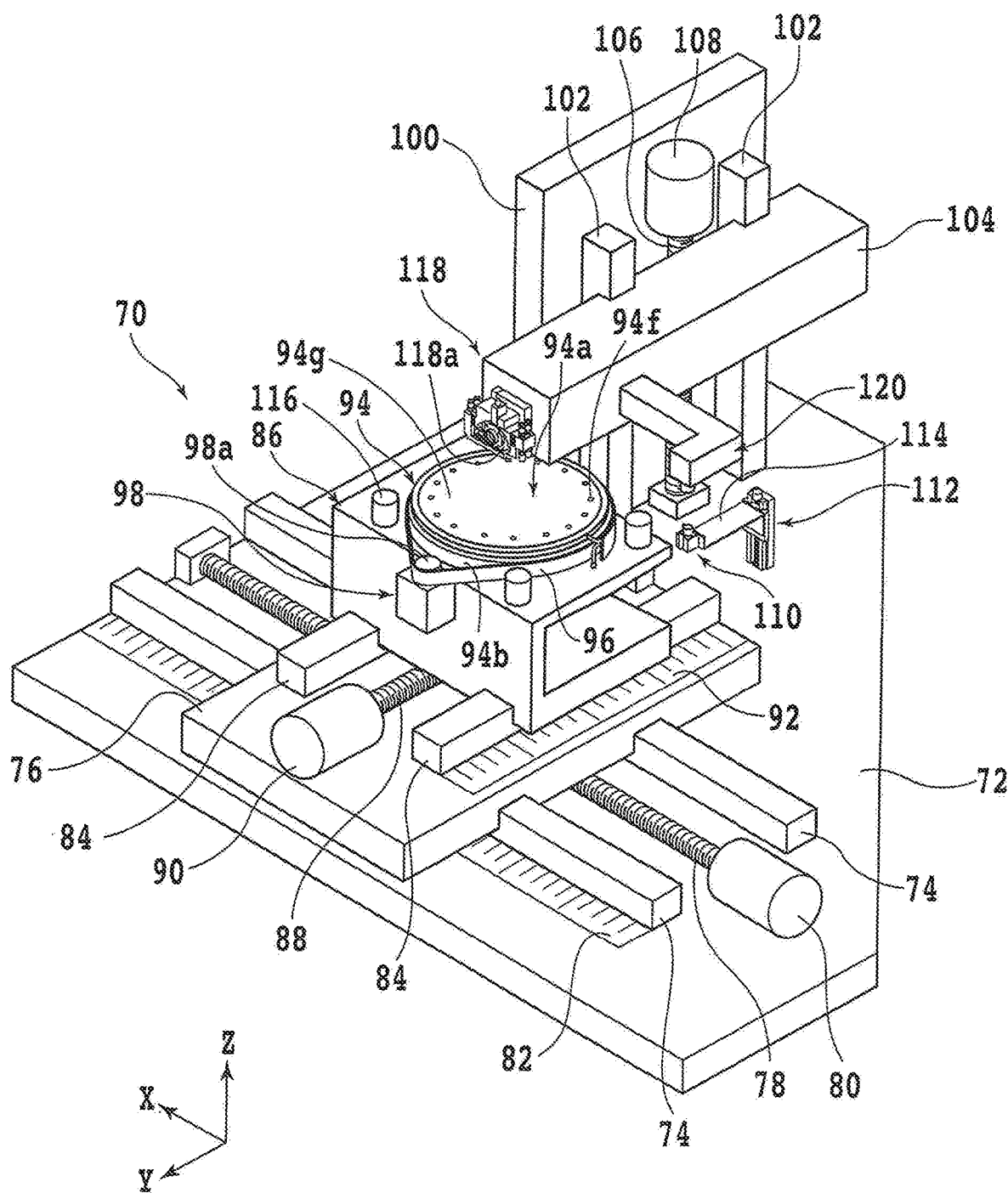
FIG. 10 is a perspective view schematically depicting a cutting machine.
Figure 11:
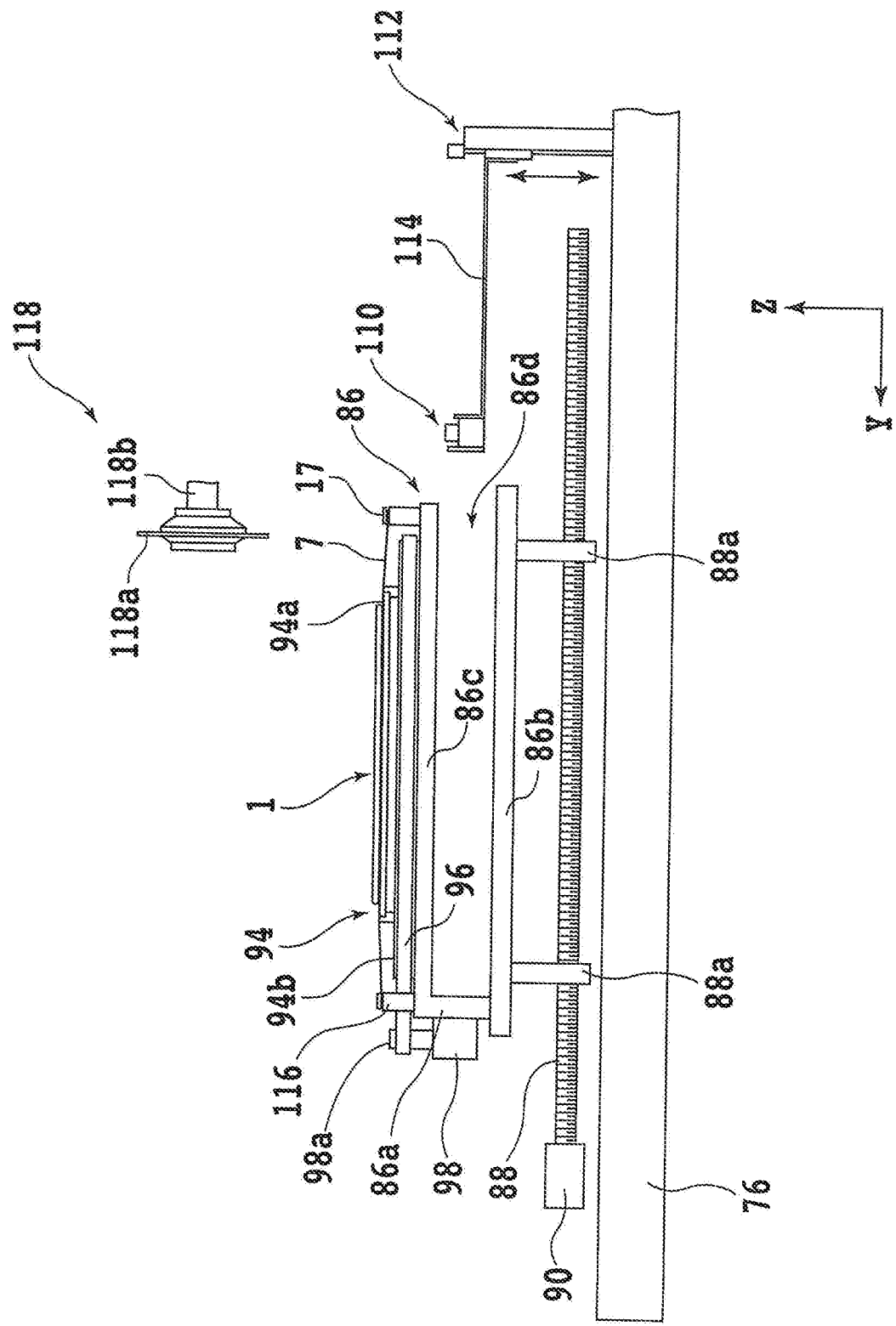
FIG. 11 is a cross-sectional view schematically depicting the cutting machine and the workpiece.
Figure 12A:
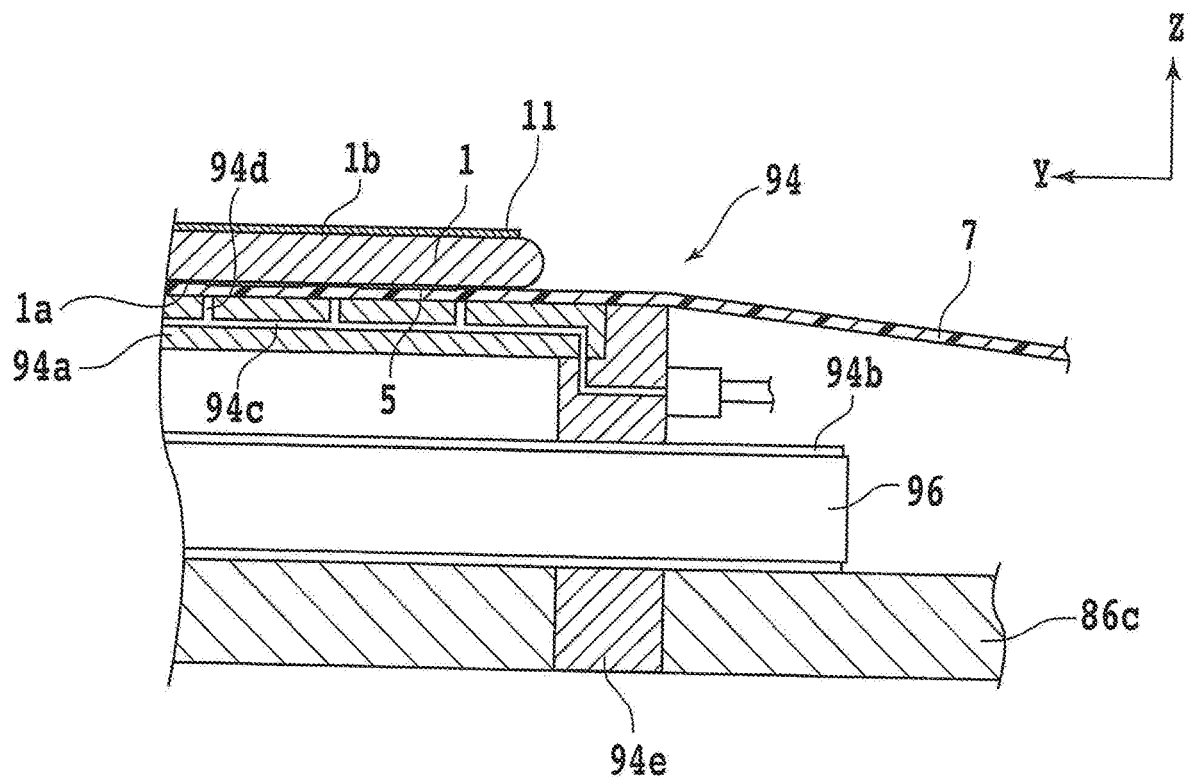
FIG. 12A is a fragmentary cross-sectional view schematically depicting, on an enlarged scale, the cutting machine and the workpiece.

A description will next be made about another example of the processing machine for use in the processing method according to the present embodiment. The processing machine for processing the workpiece 1 may also be, for example, a cutting machine including an annular cutting blade. FIG. 10 is a perspective view schematically depicting the cutting machine 70. FIG. 11 is a cross-sectional view schematically depicting the cutting machine 70 and the workpiece 1. FIG. 12A is a fragmentary cross-sectional view schematically depicting the cutting machine 70 and the workpiece 1 on an enlarged scale. The cutting machine 70 depicted in FIG. 10 includes similar constituent elements as the laser processing machine 16 depicted in FIG. 6. With respect to those included in the laser processing machine 16 and having similar structures and functions among the constituent elements of the cutting machine 70, description is partially omitted. Regarding the structures and functions of the individual constituent elements of the cutting machine 70, reference should therefore be made as needed to the description on the corresponding constituent elements included in the laser processing machine 16.

A bed 72, an X-axis guide rails 74, an X-axis moving table 76, an X-axis ball screw 78, an X-axis pulse motor 80, and an X-axis scale 82, which are included in the cutting machine 70, correspond to the respective constituent elements of the same names included in the laser processing machine 16. This also applies to Y-axis guide rails 84, a table base 86, a side wall portion 86a, a bottom wall portion 86b, a top wall portion 86c, a space 86d, a Y-axis ball screw 88, nut portions 88a, a Y-axis pulse motor 90, and a Y-axis scale 92. In addition, this also applies to a holding table (chuck table) 94, a holding member 94a, a pulley portion 94b, a suction line 94c, apertures 94d, a fitting protrusion 94e, a belt 96, a rotary drive source 98, a pulley 98a, and frame mounting portions 116. In the cutting machine 70 depicted in FIG. 10, however, the apertures 94d (see FIG. 12A) are formed in an upper surface of the holding member 94a. The apertures 94d are arranged at substantially equal intervals along an outer periphery of the holding member 94a. Inside the holding member 94a, a suction line 94c (see FIG. 12A) is disposed in communication with the individual apertures 94d. In the cutting machine 70, a portion of the holding member 94a, in which the apertures 94d and the suction line 94c are formed, functions as a suction portion 94f, and a portion other than the suction portion 94f functions as a transparent portion 94g of the holding member 94a of the holding table 94.

As depicted in FIG. 10, a column-shaped or wall-shaped support structure 100 is disposed on an upper wall of the bed 72. On a wall of the support structure 100, a pair of Z-axis guide rails 102 is fixed substantially in parallel with the Z-axis direction. To the Z-axis guide rails 102, a spindle housing 104 of a cutting unit 118 is slidably attached. On a side of the spindle housing 104 facing the support structure 100, nut portions (not depicted) are disposed, and in the nut portions, a Z-axis ball screw 106 is threaded substantially in parallel with the Z-axis guide rails 102. To an end portion of the Z-axis ball screw 106, a Z-axis pulse motor 108 is connected. When the Z-axis ball screw 106 is rotated by the Z-axis pulse motor 108, the spindle housing 104 moves in the Z-axis direction along the Z-axis guide rails 102. At a position adjacent to the Z-axis guide rails 102, a Z-axis scale (not depicted) is arranged for use upon detecting the position of the spindle housing 104 in the Z-axis direction.

The cutting unit 118 includes a spindle 118b (see FIG. 11) which acts as a rotary shaft parallel to the Y-axis direction. The spindle 118b is supported in a state of being rotatable by the above-mentioned spindle housing 104. A distal end portion of the spindle 118 is exposed from the spindle housing 104. On the distal end portion of the spindle 118b, a cutting blade 118a having abrasive grains fixed with a bonding material is mounted. On a side of a proximal end of the spindle 118b, on the other hand, a rotary drive source (not depicted) such as a motor is connected. On the spindle housing 104 of the cutting unit 118, an upper imaging unit 120 is fixed to image the workpiece 1 or the like, which is held by the holding table 94, from above. The upper imaging unit 120 of the cutting machine 70 corresponds to the upper imaging unit 52 of the laser processing machine 16. In addition, a lower imaging unit 110, a lifting/lowering support mechanism 112, and an arm portion 114 of the cutting machine 70 correspond to the lower imaging unit 54, the lifting/lowering support mechanism 56, and the arm portion 58 of the laser processing machine 16.

Figure 12B:
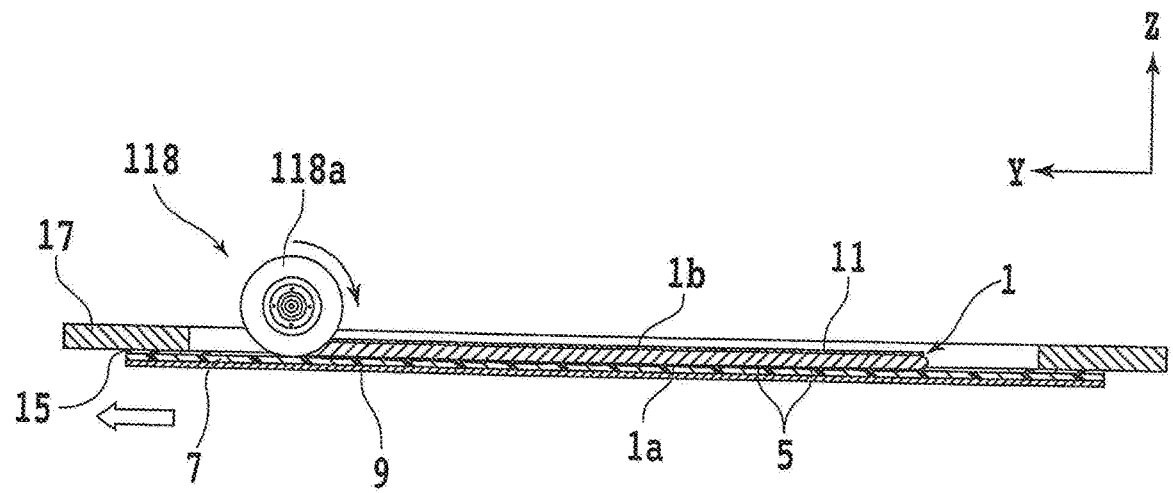
FIG. 12B is a cross-sectional view schematically depicting another example of the processing step.

In the cutting machine 70, an alignment is performed upon processing the workpiece 1. Subsequently, the workpiece 1 is cut. A cross-sectional view presented in FIG. 12B schematically depicts a positional relationship between the workpiece 1 under cutting processing and the cutting unit 118. First, the X-axis pulse motor 80 and the Y-axis pulse motor 90 are operated to position the cutting blade 118a above an extension of one of the streets 3 as an object of processing. The cutting blade 118a is then positioned at a predetermined height position so that its lower end reaches the sheet 7. Subsequently, the holding table 94 is moved along the X-axis direction while the cutting blade 118a is rotated. As a consequence, the workpiece 1 can be cut along the street 3 as the object of cutting. Such an operation is repeated until the workpiece 1 is cut along all the streets 3 set on the workpiece 1. After completion of the cutting of the workpiece 1, the suction holding by the holding table 94 is cancelled, and the workpiece 1 is unloaded from the holding table 94.

In the laser processing machine 16 or the cutting machine 70, an alignment is performed before processing or cutting the workpiece 1. At this time, the front side 1a of the workpiece 1 is imaged through the sheet 7. It has heretofore been difficult to clearly image the front side 1a of the workpiece 1 and hence to appropriately perform an alignment, if projections and depressions or the like are formed on the front side 1a of the workpiece 1. This is attributed to the generation of steps, which simulate the projections and depressions of the workpiece 1, on one side of the sheet 7, i.e., the side to be held on a holding table 40 or 94. A similar problem also arises when the one side of the sheet 7, i.e., the side to remain out of contact with the workpiece 1, is a satinized surface.

Further, when a sheet 7 with no adhesive layer included at a region corresponding to the device region of the workpiece 1, in which the plural devices 5 are formed, is brought into close contact with the front side 1a of the workpiece 1, the front side 1a having the depressions and projections, spaces may be formed between the sheet 7 and the workpiece 1. This problem is attributed to the lack of close contact between the depressions in the front side 1a of the workpiece 1 and the sheet 7. As the workpiece 1 is not sufficiently supported on the sheet 7 in this state, chips and cracks may be formed on and in device chips especially when the workpiece 1 is cut. Further, the device chips formed by the division of the workpiece 1 may separate from the sheet 7 and scatter around. Furthermore, a processing fluid that contains processing debris generated by the processing may penetrate into the spaces between the sheet 7 and the workpiece 1 and may contaminate the front side 1a of the workpiece 1.

With the foregoing problems in view, in the processing method and thermocompression method according to the present embodiment, the sheet 7 and the flat plate 9 are stacked on the workpiece 1, and the sheet 7 is thermocompression bonded to the workpiece 1 while being planarized by the flat plate 9. As a consequence, the side of the sheet 7, i.e., the side out of contact with the workpiece 1, is planarized. Even if projections and depressions are formed on and in the front side 1a of the workpiece 1, the spaces between the sheet 7 and the workpiece 1 are filled up with the sheet 7 by the thermocompression bonding of the sheet 7 to the workpiece 1. The workpiece 1 and the sheet 7 are therefore brought into close contact with each other.

A description will next be made about the processing method and thermocompression bonding method according to the present embodiment. In the processing method and thermocompression bonding method, a stacking step is performed to stack the sheet 7 and the flat plate 9 on the workpiece 1 and to form a stack in which the sheet 7 is held between the workpiece 1 and the flat plate 9. After performing the stacking step, a thermocompression bonding step is performed to heat the sheet 7 and to thermocompression bond the sheet 7 to the workpiece 1 while applying an external force to the stack and planarizing the sheet 7 by the flat plate 9. Taking FIG. 3 as an example, a description will be made about the stacking step and the thermocompression bonding step. In the stacking step, the workpiece 1, the sheet 7, and the flat plate 9 are placed in this order on the thermocompression bonding machine 2, for example. A stack is then formed on the thermocompression bonding machine 2. In the stacking step, however, the stack may be formed outside the thermocompression bonding machine 2. If this is the case, the stack is placed on the thermocompression bonding machine 2 before performing the thermocompression bonding step.

In the stacking step, upon formation of the stack, the sheet 7 is brought into contact with one side of the workpiece 1, i.e., the side to be directed toward the holding table of the processing machine when processing is subsequently performed on the workpiece 1. If the workpiece 1 is subsequently processed from the back side 1b, for example, the sheet 7 and the flat plate 9 are stacked on the front side 1a of the workpiece 1 in the stacking step. At this time, the entire area of the front side 1a of the workpiece 1 should be covered by the sheet 7.

In the thermocompression bonding step, the selector valve 12 of the thermocompression bonding machine 2 is first operated to apply a negative pressure, which is produced by the suction source 10, to the workpiece 1 through the suction line 8 and the porous member 6, whereby the workpiece 1 is attracted under suction on the thermocompression bonding machine 2. It is, however, not absolutely necessary to attract the workpiece 1 under suction. The heater 14 is next activated to heat the stack. At this time, heat is transmitted to the sheet 7 through the workpiece 1 so that the sheet 7 is heated. The output of the heater is therefore set so that the temperature of the sheet 7 heated through the workpiece 1 rises to a temperature (softening point) where the sheet 7 becomes soft, or higher. However, if the temperature of the sheet 7 becomes excessively high and exceeds the melting point, it becomes no longer possible to control the shape and properties of the sheet 7. If the sheet 7 is a certain type of polyolefin sheet, for example, the temperature of the upper surface of the thermocompression bonding machine 2 is set at approximately 100° C. so that the sheet 7 is heated to a temperature of 60° C. or higher but 80° C. or lower. The stack is then heated for one minute or so by the thermocompression bonding machine 2. Here, the flat plate 9 is pressed by a predetermined force from above. As a consequence, the sheet 7 is thermocompression bonded to the front side 1a of the workpiece 1.

When the external force is applied to the stack to have the sheet 7 thermocompression bonded to the workpiece 1, the sheet 7 deforms following the shape of the front side 1a of the workpiece 1 even if projections and depressions are formed on and in the front side 1a of the workpiece 1. No space is therefore formed between the front side 1a of the workpiece 1 and the sheet 7, and the sheet 7 comes into firm and close contact with the workpiece 1. Further, in the case where a projection-depression shape, which simulates a projection-depression shape of the front side 1a of the workpiece 1, appears on the other side of the sheet 7, i.e., the other side remaining out of contact with the workpiece 1, or in the case where the other side of the sheet 7 has been satinized, the other side of the sheet 7 is planarized when the thermocompression bonding is performed. This is attributed to the pressing of the sheet 7 by the planar surface of the flat plate 9 in the course of the performance of the thermocompression bonding step and the resulting deformation of the sheet 7 following the shape of the flat plate 9. Subsequently, the application of the external force to the stack is canceled, and the heater 14 is deactivated. The selector valve 12 is then operated to disconnect the suction source 10 and the suction line 8 from each other, whereby the suction holding of the workpiece 1 is cancelled. Subsequently, the workpiece 1 thermocompression bonded to the sheet 7 is picked up from the thermocompression bonding machine 2, and the thermocompression bonding is ended.

The stacking step and the thermocompression bonding step may be performed by the thermocompression bonding machine 2a depicted in FIGS. 4A and 4B. If this is the case, the workpiece 1, the sheet 7, and the annular frame 17 can be integrated to form a frame unit. The integration of the workpiece 1 into the form of the frame unit facilitates the subsequent handling. Moreover, when the workpiece 1 is divided to form device chips, the device chips are supported on the frame 17 via the sheet 7.

In this case, the workpiece 1 is placed, with the back side 1b directed downward, on the up/down table 62 inside the housing of the thermocompression bonding machine 2a in the stacking step. In the example depicted in FIG. 4A, etc., the metal layer 11 is formed on the back side 1b of the workpiece 1, so that the metal layer 11 comes into contact with the upper surface of the up/down table 62. Further, the frame 17 is placed on the frame support base 60 inside the housing. At this time, the workpiece 1 is received in the opening of the frame 17. Subsequently, the sheet 7 is arranged above the workpiece 1 and the frame 17, and the flat plate 9 is arranged on the sheet 7. In the example depicted in FIGS. 4A and 4B, the sheet 7 has the adhesive layer 15 at the region that does not correspond to the device region of the workpiece 1. When the sheet 7 is placed on the frame 17, the sheet 7 and the frame 17 are bonded together by the adhesive layer 15. The selector valve 66 is next operated to connect the compressor unit 68 to the pressurization space of the thermocompression bonding machine 2a through the duct line 64, whereby the pressure in the pressurization space is increased. As depicted in FIG. 4B, the up/down table 62 then ascends so that the front side 1a of the workpiece 1 comes into contact with the sheet 7. The sheet 7 is then held between the workpiece 1 and the flat plate 9, whereby a stack of the workpiece 1, the sheet 7, and the flat plate 9 is formed.

In the thermocompression bonding machine 2a, the thermocompression bonding step is then performed. The up/down table 62 is caused to ascend further so that the workpiece 1 is pressed toward the sheet 7 by the up/down table 62. At the same time, the heater 14a is activated to heat the sheet 7 through the workpiece 1. By raising the temperature of the sheet 7 to the softening point or higher, the sheet 7 and the workpiece 1 can be thermocompression bonded to each other. Subsequently, the selector valve 66 is operated to connect the pressurizing space of the thermocompression bonding machine 2a and the external space of the thermocompression bonding machine 2a, whereby the pressure in the pressurization space decreases. As a consequence, the up/down table 62 descends. As the workpiece 1 has already been thermocompression bonded to the sheet 7 at this time, the workpiece 1 is brought into a floating state relative to the up/down table 62. In other words, the workpiece 1 is integrated with the sheet 7 and the frame 17 to form a frame unit.

As an alternative, the stacking step and the thermocompression bonding step may also be performed by the thermocompression bonding machine 2b depicted in FIGS. 5A and 5B. In this case, the workpiece 1, the sheet 7, and the annular frame 17 are also integrated to form a frame unit. If this is the case, in the stacking step and the thermocompression bonding step, the workpiece 1 and the frame 17 are placed on the thermocompression bonding machine 2b, with the back side 1b of the workpiece 1 directed downward, and the sheet 7 and the flat plate 9 are arranged above the workpiece 1 and the frame 17, as depicted in FIG. 5A. The heater 14b is next activated to heat the frame 17 and the workpiece 1. As depicted in FIG. 5B, the selector valve 12b is then operated to bring the suction source 10b into communication with the suction line 8b, whereby the space surrounded by the thermocompression bonding machine 2b, the frame 17, and the sheet 7 is depressurized. In this case, the flat plate 9 is pressed downward by a difference in pressure between the inside and the outside of the space, and the sheet 7 enters the opening of the frame 17 while undergoing a deformation and comes into close contact with the front side 1a of the workpiece 1. The sheet 7 is then heated through the workpiece 1. When the temperature of the sheet 17 rises to the softening point or higher, the sheet 7 is thermocompression bonded to the workpiece 1.

In the foregoing, the description was made about the case in which the stacking step and the thermocompression bonding step concurrently proceed in the thermocompression bonding machine 2b. Similarly to the stacking step and the thermocompression bonding step in the thermocompression bonding machine 2a, these steps may also be performed successively in the thermocompression bonding machine 2b. Further, the stacking step and the thermocompression bonding step may be allowed to proceed concurrently in the thermocompression bonding machine 2a.

In the processing method according to the present embodiment, the workpiece 1 is next processed by the processing machine. Before processing the workpiece 1, a separation step may additionally be performed to separate the flat plate 9 from the stack. If this is the case, the workpiece 1 thermocompression bonded to the sheet 7 is loaded onto the processing machine. However, the processing method according to the present embodiment is not limited to the foregoing. Described specifically, the stack with the flat plate 9 included therein may be loaded onto the processing machine, and the workpiece 1 may then be processed in the state in which the workpiece 1 is included in the stack.

A description will next be made about the holding step, the alignment step, and the processing step. The description will hereinafter be made taking as an example a case in which the workpiece 1, which has become a part of a frame unit by performance of the separation step beforehand to separate the flat plate 9 and integration of the workpiece 1 with the sheet 7 and the frame 17, is processed with a laser beam in the laser processing machine 16 depicted in FIG. 6.

In the laser processing machine 16, the holding step is first performed to hold the workpiece 1 via the sheet 7 on the holding table 40. As mentioned above, the holding member 40a of the holding table 40 has the transparent portion 40g with the transparent member included therein. In the holding step, as depicted in FIG. 7, the workpiece 1 is placed on the holding member 40a of the holding table 40 with the sheet 7 interposed therebetween, and the annular frame 17 is placed on the frame mounting portion 46. A negative pressure is then applied to the workpiece 1 through the suction line 40c and the suction grooves 40d depicted in FIG. 8, whereby the workpiece 1 is held under suction on the holding table 40. As a consequence, the back side 1b of the workpiece 1 is upwardly exposed, thereby establishing a state in which a laser beam can be applied from the laser processing unit 50 to the back side 1b of the workpiece 1.

After performing the holding step, the alignment step is performed. In the alignment step, the workpiece 1 is imaged through the transparent portion 40g of the holding member 40a of the holding table 40 and the sheet 7, and an alignment involving the laser processing unit 50 (processing unit) is performed. FIG. 9A is a cross-sectional view schematically depicting the alignment step. In the alignment step, the holding table 40 is moved to position the lower imaging unit 54 below the workpiece 1 held on the holding table 40. Specifically, the lower imaging unit 54 is positioned below the transparent portion 40g. The lower imaging unit 54 is then operated to image the front side 1a of the workpiece 1 through the transparent portion 40g of the holding table 40. As the thermocompression bonding step has been performed in the processing method according to the present embodiment, the spaces between the sheet 7 and the workpiece 1 have been filled up. In addition, the sheet 7 has been planarized by the flat plate 9. Accordingly, when the workpiece 1 is imaged through the sheet 7, a clear captured image is obtained. The position and direction of each street 3 on the workpiece 1, the pitch between the streets 3, and the like can therefore be detected with high accuracy from the captured image, so that precise alignment can be performed.

The processing step is next performed by the laser processing unit 50 (processing unit) to process the workpiece 1. FIG. 9B is a cross-sectional view schematically depicting the processing step. In the processing step, the rotary drive source 44 is first operated to rotate the holding table 40, whereby the streets 3 are brought into alignment with the X-axis direction (processing feed direction). Further, the laser processing unit 50 is moved to a position above an extension of the street 3 as an object on which processing is to be performed first. The optical system of the laser processing unit 50 is then adjusted to position the height position of the focal point 50b of the laser processing unit 50 at a predetermined height. The workpiece 1 is then fed for processing while the laser beam 50a, which has a wavelength transmissible through the workpiece 1, is applied from the laser processing unit 50 onto the back side 1b of the workpiece 1. As a consequence, the modified layer 3a is formed along the street 3 inside the workpiece 1.

After completion of the laser processing along the street 3, the workpiece 1 is index-fed along the Y-axis direction, whereby the workpiece 1 is likewise processed with the laser beam successively along the remaining streets 3. After the workpiece 1 is processed with the laser beam along all the streets 3 in the X-axis direction, the workpiece 1 is turned to be processed with the laser beam along the streets 3 in another direction. In this manner, the modified layers 3a are formed inside the workpiece 1 along all the streets 3 of the workpiece 1, and the processing step is ended. Subsequently, the workpiece 1 is unloaded from the laser processing machine 16 and is rinsed, and the sheet 7 is caused to spread outward. As a consequence, cracks grow upward and downward from the modified layers 3a, so that the workpiece 1 is divided to form individual device chips. The device chips are then picked up from the sheet 7 and are mounted and used on predetermined mounting objects. In the processing step, a laser beam of a wavelength that the workpiece 1 can absorb may be applied to subject the workpiece 1 to ablation processing.

In addition, the holding step, the alignment step, and the processing step may also be performed in the cutting machine 70 depicted in FIG. 10. A description will next be made about a case in which the workpiece 1 included in the frame unit, which has been formed by thermocompression bonding the sheet 7 to the front side 1a of the workpiece 1 and bonding the sheet 7 to the frame 17 via the adhesive layer 15, is cut in the cutting machine 70. The description will hereinafter be made taking as an example the case in which the metal layer 11 is formed on the back side 1b of the workpiece 1.

The holding step and the alignment step proceed as in the above-mentioned case that they are performed in the laser processing machine 16, and therefore their description is partially omitted. The description on the holding step and the alignment step performed in the above-mentioned laser processing machine 16 should be referred to as needed. In the holding step, as depicted in FIG. 11, the workpiece 1 is placed on the holding member 94a of the holding table 94 with the sheet 7 interposed therebetween, and the annular frame 17 is mounted on the frame mounting portion 116. A negative pressure is next applied to the workpiece 1 through the suction line 94c and the apertures 94d depicted in FIG. 12B, whereby the workpiece 1 is held under suction on the holding table 94. As a consequence, the back side 1b of the workpiece 1 is directed upward, and the metal layer 11 formed on the back side 1b is exposed upwardly.

Especially if the metal layer 11 is formed on the back side 1b, it is difficult to image the front side 1a of the workpiece 1 by using the upper imaging unit 120 disposed above the holding table 94. In the alignment step to be performed following the holding step, the front side 1a of the workpiece 1 is thus imaged using the lower imaging unit 110. In other words, in the alignment step, the alignment involving the cutting unit 118 (processing unit) is performed by imaging the workpiece 1 through the transparent portion 94g of the holding member 94a of the holding table 94 and the sheet 7.

Next, the processing step is performed to process the workpiece 1 by the cutting unit 118 (processing unit). FIG. 12B is a cross-sectional view schematically depicting the processing step. In the processing step, the rotary drive source 44 is first operated to rotate the holding table 40 so that the streets 3 are brought into alignment with the X-axis direction (processing feed direction). Further, the cutting unit 118 is moved to a position above an extension of the street 3 as an object on which processing is to be performed first. While the cutting blade 118a is rotated about the spindle 118b as an axis of rotation, the cutting unit 118 is caused to descend until the lower end of the cutting blade 118a assumes a predetermined height where the lower end of the cutting blade 118a reaches the sheet 7. While the rotation of the cutting blade 118a is continued, the workpiece 1 is fed for processing. As a consequence, the workpiece 1 is cut and divided along the street 3. The workpiece 1 is divided along all the streets 3, whereby individual device chips are formed.

In the processing method according to the present embodiment, since no space remains between the workpiece 1 and the sheet 7 and the workpiece 1 is appropriately supported on the sheet 7, occurrence of chips and cracks is suppressed even when the workpiece 1 is cut. In the processing method according to the present embodiment, the workpiece 1 is thermocompression bonded to the sheet 7, and therefore, the sheet 7 and the workpiece 1 are brought into firm and close contact with each other. Accordingly, the workpiece 1 or the device chips remain firmly supported on the sheet 7 during the processing step and a rinsing step or the like to be performed after the processing step. Therefore, neither the workpiece 1 nor the device chips separate and fly off from the sheet 7. Moreover, no space remains between the workpiece 1 and the sheet 7, thereby resolving the penetration problem of a contamination source which would otherwise arise.

In the foregoing embodiment, the description was made about the cases in which the sheet 7 is heated using the heaters 14, 14a, and 14b included in the thermocompression bonding machines 2, 2a, and 2b. However, the first and second aspects of the present invention are not limited to such heating. For example, the thermocompression bonding machines 2, 2a, and 2b may include an infrared lamp capable of applying infrared rays onto the sheet 7 or a heat gun capable of supplying hot air to the sheet 7. In other words, the sheet 7 may be heated by the infrared ray or the heat gun in the thermocompression bonding step.

In the above-described embodiment, the description was made primarily about the case in which a projection-depression shape is formed on the front side 1a of the workpiece 1. However, the first and second aspects of the present invention are not limited such a workpiece. In other words, no projection-depression shape may be formed on the front side 1a of the workpiece 1. The description was also made about the case where, in the processing step, the workpiece 1 is processed from the back side 1b. However, the front side 1a of the workpiece 1 may be exposed as an upper surface, and the workpiece 1 may be processed from the front side 1a.

With respect to the processing step, the description was made taking, as examples, the case in which the workpiece 1 is processed with a laser beam by the laser processing unit and the case in which the workpiece 1 is cut by the cutting unit. However, the first aspect of the present invention is not limited to such cases. In the processing step, the workpiece 1 may, for example, be ground on the back side 1b by a grinding unit or be polished on the back side 1b by a polishing unit. In such a case, the separation of the workpiece 1 from the sheet 7 is suppressed to enable high-quality processing, since, according to the first aspect of the present invention, the workpiece 1 is brought into firm and close contact with the sheet 7.

The present invention is not limited to the details of the above-described preferred embodiment. The scope of the invention is defined by the appended claims and all changes and modifications as fall within the equivalence of the scope of the claims are therefore to be embraced by the invention.

What is claimed is:

1. A processing method for a workpiece, comprising:
    a stacking step of stacking a sheet and a flat plate on a front side of the workpiece to form a stack in which the sheet is held between the workpiece and the flat plate,
    a thermocompression bonding step of thermocompression bonding the sheet to the workpiece while planarizing the sheet with the flat plate by heating the sheet and pressing the flat plate against the sheet,
    a holding step of holding the workpiece via the sheet by a holding table, after performing the thermocompression bonding step, the holding table having a transparent portion with a transparent member included therein,
    an alignment step of performing an alignment by imaging the workpiece through the transparent portion and the sheet, after performing the holding step, and
    a processing step of processing the workpiece by a processing unit after performing the alignment step.

2. The processing method according to claim 1, wherein the workpiece has projections and depressions on the front side,
    the sheet has a thickness greater than a difference in height between the projections and the depressions,
    the sheet is stacked on the front side of the workpiece in the stacking step,
    the sheet is thermocompression bonded to the front side of the workpiece in the thermocompression bonding step,
    the workpiece is held on the front side of the workpiece via the sheet by the holding table in the holding step, and
    the workpiece is processed from a back side of the workpiece by the processing unit in the processing step.

3. The processing method according to claim 1, wherein the workpiece has, on the front side of the workpiece, a device region in which a plurality of devices is formed, and the sheet has an adhesive layer at a region not corresponding to the device region of the workpiece.

4. The processing method according to claim 1, wherein the sheet includes an adhesive layer on a peripheral portion of the sheet but not on a portion of the sheet corresponding to a device region of the workpiece.

5. The processing method according to claim 1, wherein the holding table includes a heater configured for heating the sheet in the thermocompression bonding step.

* * * * *